US008486192B2

(12) United States Patent
Bertram, Jr.

(10) Patent No.: US 8,486,192 B2
(45) Date of Patent: Jul. 16, 2013

(54) THERMALIZING GAS INJECTORS FOR GENERATING INCREASED PRECURSOR GAS, MATERIAL DEPOSITION SYSTEMS INCLUDING SUCH INJECTORS, AND RELATED METHODS

(75) Inventor: Ronald Thomas Bertram, Jr., Mesa, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/894,724

(22) Filed: Sep. 30, 2010

(65) Prior Publication Data
US 2012/0083100 A1    Apr. 5, 2012

(51) Int. Cl.
C23C 16/00        (2006.01)
C23C 16/448       (2006.01)

(52) U.S. Cl.
USPC ....... 118/715; 118/726; 438/738; 257/E21.09

(58) Field of Classification Search
USPC .............. 118/715, 726; 438/738; 257/E21.09
See application file for complete search history.

(56) References Cited

U.S. PATENT DOCUMENTS

| | | | |
|---|---|---|---|
| 3,146,137 A | | 8/1964 | Williams et al. |
| 3,679,949 A | * | 7/1972 | Uekusa et al. ............ 257/449 |
| 4,016,589 A | * | 4/1977 | Tanimura et al. ............ 257/37 |
| 4,792,467 A | | 12/1988 | Melas et al. |
| 4,839,145 A | | 6/1989 | Gale et al. |
| 5,035,767 A | | 7/1991 | Nishizawa |
| 5,077,875 A | | 1/1992 | Hoke et al. |
| 5,146,869 A | * | 9/1992 | Bohannon et al. ............ 118/724 |
| 5,250,148 A | | 10/1993 | Nishizawa et al. |
| 5,589,110 A | * | 12/1996 | Motoda et al. .................. 261/61 |
| 5,782,980 A | | 7/1998 | Allen et al. |
| 6,080,241 A | | 6/2000 | Li et al. |
| 6,090,705 A | | 7/2000 | Arena et al. |

(Continued)

FOREIGN PATENT DOCUMENTS

| | | | |
|---|---|---|---|
| JP | 59188118 | * | 10/1984 |
| JP | 63-045199 | * | 2/1988 |

(Continued)

OTHER PUBLICATIONS

Werkhoven, Christiaan J., U.S. Appl. No. 12/895,311 entitled, Systems and Methods for Forming Semiconductor Materials by Atomic Layer Deposition, filed Sep. 30, 2010.

(Continued)

*Primary Examiner* — Parviz Hassanzadeh
*Assistant Examiner* — Satish Chandra
(74) *Attorney, Agent, or Firm* — TraskBritt

(57) ABSTRACT

Methods of depositing material on a substrate include forming a precursor gas and a byproduct from a source gas within a thermalizing gas injector. The byproduct may be reacted with a liquid reagent to form additional precursor gas, which may be injected from the thermalizing gas injector into a reaction chamber. Thermalizing gas injectors for injecting gas into a reaction chamber of a deposition system may include an inlet, a thermalizing conduit, a liquid container configured to hold a liquid reagent therein, and an outlet. A pathway may extend from the inlet, through the thermalizing conduit to an interior space within the liquid container, and from the interior space within the liquid container to the outlet. The thermalizing conduit may have a length that is greater than a shortest distance between the inlet and the liquid container. Deposition systems may include one or more such thermalizing gas injectors.

26 Claims, 7 Drawing Sheets

U.S. PATENT DOCUMENTS

| | | | |
|---|---|---|---|
| 6,110,809 A | | 8/2000 | Sze et al. |
| 6,121,140 A | | 9/2000 | Arena et al. |
| 6,126,719 A | | 10/2000 | Sturgill et al. |
| 6,153,010 A | | 11/2000 | Kiyoku et al. |
| 6,153,012 A | | 11/2000 | Rupp et al. |
| 6,179,913 B1 | * | 1/2001 | Solomon et al. ............... 117/99 |
| 6,206,971 B1 | | 3/2001 | Umotoy et al. |
| 6,207,844 B1 | | 3/2001 | Kouvetakis et al. |
| 6,355,107 B1 | * | 3/2002 | Solomon et al. ............ 118/726 |
| 6,440,494 B1 | | 8/2002 | Arena-Foster |
| 6,495,707 B1 | | 12/2002 | Leese et al. |
| 6,569,765 B1 | * | 5/2003 | Solomon et al. ............. 438/680 |
| 6,632,725 B2 | | 10/2003 | Trassoudaine et al. |
| 6,689,252 B1 | | 2/2004 | Shamouilian et al. |
| 6,733,591 B2 | | 5/2004 | Anderson |
| 6,815,362 B1 | | 11/2004 | Wong et al. |
| 6,911,083 B2 | | 6/2005 | Hara |
| 6,921,062 B2 | | 7/2005 | Gregg et al. |
| 7,011,711 B2 | | 3/2006 | Shreter et al. |
| 7,118,781 B1 | | 10/2006 | Sumakeris et al. |
| 7,128,785 B2 | * | 10/2006 | Kaeppeler et al. ............. 117/90 |
| 7,279,047 B2 | | 10/2007 | Melnik et al. |
| 7,413,982 B2 | | 8/2008 | Levy |
| 7,456,429 B2 | | 11/2008 | Levy |
| 7,501,023 B2 | | 3/2009 | Dmitriev et al. |
| 7,572,686 B2 | | 8/2009 | Levy et al. |
| 7,608,526 B2 | | 10/2009 | Cody et al. |
| 7,670,435 B2 | | 3/2010 | Tsvetkov et al. |
| 2002/0100418 A1 | | 8/2002 | Sandhu et al. |
| 2003/0024475 A1 | | 2/2003 | Anderson |
| 2003/0221617 A1 | * | 12/2003 | Lim ............................ 118/715 |
| 2004/0025370 A1 | * | 2/2004 | Guenther ...................... 34/576 |
| 2005/0221021 A1 | | 10/2005 | Strang |
| 2005/0242061 A1 | | 11/2005 | Fukuda |
| 2005/0258459 A1 | | 11/2005 | Hwang et al. |
| 2006/0008941 A1 | | 1/2006 | Haskell et al. |
| 2006/0011135 A1 | | 1/2006 | Dmitriev et al. |
| 2006/0040475 A1 | | 2/2006 | Emerson |
| 2006/0042544 A1 | | 3/2006 | Hasebe et al. |
| 2006/0115595 A1 | | 6/2006 | Shenai-Khatkhate et al. |
| 2006/0226117 A1 | | 10/2006 | Bertram et al. |
| 2006/0228473 A1 | | 10/2006 | Satoh et al. |
| 2006/0275546 A1 | | 12/2006 | Arena et al. |
| 2007/0014990 A1 | * | 1/2007 | Arico et al. ................... 428/408 |
| 2007/0238311 A1 | | 10/2007 | Levy |
| 2008/0166880 A1 | | 7/2008 | Levy |
| 2008/0166884 A1 | | 7/2008 | Nelson et al. |
| 2008/0248200 A1 | | 10/2008 | Arena et al. |
| 2009/0081366 A1 | | 3/2009 | Kerr et al. |
| 2009/0081842 A1 | | 3/2009 | Nelson et al. |
| 2009/0081885 A1 | | 3/2009 | Levy et al. |
| 2009/0130858 A1 | | 5/2009 | Levy |
| 2009/0178611 A1 | | 7/2009 | Arena et al. |
| 2009/0205563 A1 | | 8/2009 | Arena et al. |
| 2009/0214785 A1 | * | 8/2009 | Arena et al. ............. 427/255.28 |
| 2009/0217878 A1 | | 9/2009 | Levy et al. |
| 2009/0223441 A1 | | 9/2009 | Arena et al. |
| 2009/0223442 A1 | * | 9/2009 | Arena et al. .................... 117/99 |
| 2009/0223453 A1 | | 9/2009 | Arena et al. |
| 2009/0283029 A1 | | 11/2009 | Arena et al. |
| 2010/0000681 A1 | | 1/2010 | Bertram et al. |
| 2010/0041213 A1 | | 2/2010 | Lee |
| 2010/0258053 A1 | | 10/2010 | Arena et al. |

FOREIGN PATENT DOCUMENTS

| | | | |
|---|---|---|---|
| JP | 63316425 | * | 12/1988 |
| JP | 04132681 | | 5/1992 |
| WO | 0068471 | | 11/2000 |
| WO | WO2010024671 | | 3/2010 |
| WO | WO2010/101715 | | 9/2010 |
| WO | WO 2010/101715 | * | 9/2010 |

OTHER PUBLICATIONS

Levy et al., Oxide Electronics by Spatial Atomic Layer Deposition, Journal of Display Technology, vol. 5, No. 12, Dec. 2009, pp. 484-494.

Kim et al., Atomic Layer Deposition of GaN Using GaCl3 and NH3, J. Vac. Sci. Technol. Jul./Aug. 2009, vol. A 27, pp. 923-928.

French Search Report for French Application No. 1058774 dated Jun. 14, 2011, 2 pages.

French Written Opinion for French Application No. 1058774 dated Jun. 14, 2011, 5 pages.

Lee et al., Vapor Phase Epitaxy of GaN Using AgCl3/N2 and NH3/N2, Journal of Crystal Growth, 169: 689-696 (1996).

Varadarajan et al., On the Chloride Vapor-Phase Epitaxy Growth of GaN and its Characterization, Journal of Crystal Growth, 260: 43-49 (2004).

International Search Report and Written Opinion for International Application No. PCT/US2007/084820 dated Apr. 9, 2008.

International Search Report and Written Opinion for International Application No. PCT/US2007/070721 dated Feb. 1, 2008.

International Search Report and Written Opinion for International Application No. PCT/US2007/084826 dated Mar. 31, 2008.

International Search Report and Written Opinion for International Application No. PCT/US2007/084845 dated May 22, 2008.

International Search Report and Written Opinion for International Application No. PCT/US2007/084935 dated May 7, 2008.

Standard Search Report, European Patent Office, dated Jan. 31, 2007.

Bertram, Ronald, U.S. Appl. No. 61/526,143 entitled Deposition Systems Including a Precursor Gas Furnace Within a Reaction Chamber, and Related Methods filed Aug. 22, 2011.

* cited by examiner

US 8,486,192 B2

THERMALIZING GAS INJECTORS FOR GENERATING INCREASED PRECURSOR GAS, MATERIAL DEPOSITION SYSTEMS INCLUDING SUCH INJECTORS, AND RELATED METHODS

FIELD

Embodiments of the invention generally relate to systems for depositing materials on substrates, to components of such systems, and to methods of making and using such components and systems. More particularly, embodiments of the invention relate to chemical vapor deposition systems for depositing III-V semiconductor materials on substrates, to components of such systems, and to methods of making and using such components and systems.

BACKGROUND

Chemical vapor deposition (CVD) is a chemical process that is used to deposit solid materials on substrates, and is commonly employed in the manufacture of semiconductor devices. In chemical vapor deposition processes, a substrate is exposed to one or more reagent gases, which react, decompose, or both react and decompose in a manner that results in the deposition of a solid material on the surface of the substrate.

One particular type of CVD process is referred to in the art as vapor phase epitaxy (VPE). In VPE processes, a substrate is exposed to one or more reagent vapors in a reaction chamber, which react, decompose, or both react and decompose in a manner that results in the epitaxial deposition of a solid material on the surface of the substrate. VPE processes are often used to deposit III-V semiconductor materials. When one of the reagent vapors in a VPE process comprises a hydride vapor, the process may be referred to as a hydride vapor phase epitaxy (HVPE) process.

HVPE processes are used to form III-V semiconductor materials such as, for example, gallium nitride (GaN). In such processes, epitaxial growth of GaN on a substrate results from a vapor phase reaction between gallium chloride (GaCl) and ammonia ($NH_3$) that is carried out within a reaction chamber at elevated temperatures between about 500° C. and about 1,000° C. The $NH_3$ may be supplied from a standard source of $NH_3$ gas.

In some methods, the GaCl vapor is provided by passing hydrogen chloride (HCl) gas (which may be supplied from a standard source of HCl gas) over heated liquid gallium (Ga) to form GaCl in situ within the reaction chamber. The liquid gallium may be heated to a temperature of between about 750° C. and about 850° C. The GaCl and the $NH_3$ may be directed to (e.g., over) a surface of a heated substrate, such as a wafer of semiconductor material. U.S. Pat. No. 6,179,913, which issued Jan. 30, 2001 to Solomon et al., discloses a gas injection system for use in such systems and methods, the entire disclosure of which patent is incorporated herein by reference.

In such systems, it may be necessary to open the reaction chamber to atmosphere to replenish the source of liquid gallium. Furthermore, it may not be possible to clean the reaction chamber in situ in such systems.

To address such issues, methods and systems have been developed that utilize an external source of a $GaCl_3$ precursor, which is directly injected into the reaction chamber. Examples of such methods and systems are disclosed in, for example, U.S. Patent Application Publication No. US 2009/0223442 A1, which published Sep. 10, 2009 in the name of Arena et al., now U.S. Pat. No. 8,382,898, issued Feb. 26, 2013, the entire disclosure of which publication is incorporated herein by reference.

BRIEF SUMMARY

This summary is provided to introduce a selection of concepts in a simplified form, which concepts are further described in the detailed description below of some example embodiments of the invention. This summary is not intended to identify key features or essential features of the claimed subject matter, nor is it intended to be used to limit the scope of the claimed subject matter.

In some embodiments, the present invention includes method of depositing material, such as a semiconductor material, on a substrate. A source gas may be introduced into a thermalizing gas injector, and the source gas may be thermally decomposed within the thermalizing gas injector to form a precursor gas and a byproduct. The byproduct may be reacted with a liquid reagent within the thermalizing gas injector to form additional precursor gas. The precursor gas and the additional precursor gas may be injected from the thermalizing gas injector into a space within a reaction chamber, and material may be deposited on the substrate within the reaction chamber using the precursor gas.

In additional embodiments, the present invention includes thermalizing gas injectors for injecting one or more gases into a reaction chamber of a deposition system. The thermalizing gas injectors include an inlet, a thermalizing conduit, a liquid container configured to hold a liquid reagent therein, and an outlet. A pathway extends from the inlet, through the thermalizing conduit to an interior space within the liquid container, and from the interior space within the liquid container to the outlet. The thermalizing conduit may have a length that is greater than a shortest distance between the inlet and the liquid container.

In yet further embodiments, the present invention includes deposition systems comprising a reaction chamber and at least one thermalizing gas injector that is configured to inject one or more gases into the reaction chamber. The thermalizing gas injector includes an inlet, a thermalizing conduit, a liquid container configured to hold a liquid reagent therein, and an outlet. A pathway extends from the inlet, through the thermalizing conduit to an interior space within the liquid container, and from the interior space within the liquid container to the outlet. The thermalizing conduit may have a length that is greater than a shortest distance between the inlet and the liquid container.

BRIEF DESCRIPTION OF THE DRAWINGS

The present invention may be understood more fully by reference to the following detailed description of example embodiments of the present invention, which are illustrated in the appended figures in which.

DETAILED DESCRIPTION OF EMBODIMENTS OF THE INVENTION

Figure 1A:
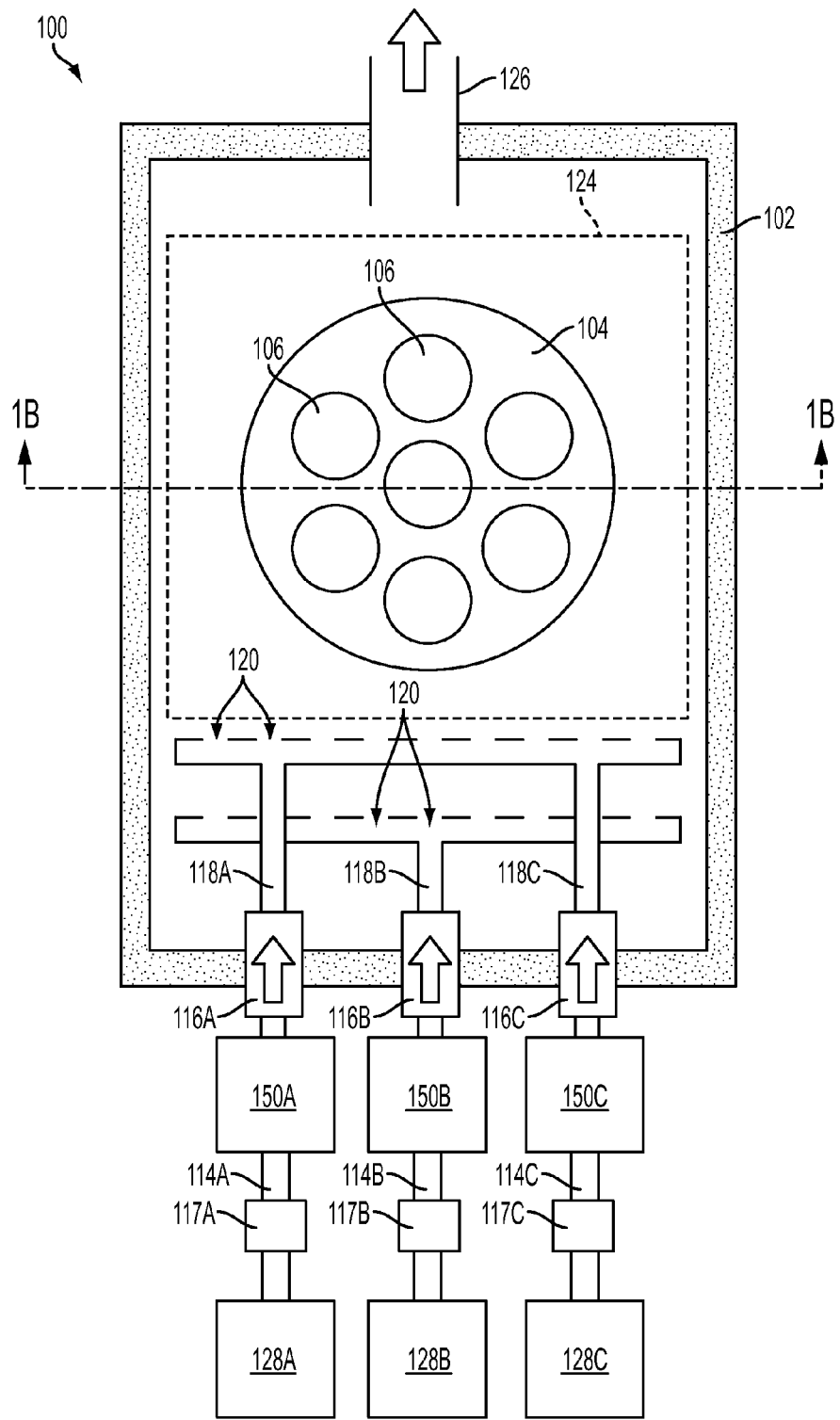
FIG. 1A is a cross-sectional view schematically illustrating an example embodiment of a deposition system of the invention that includes a reaction chamber and at least one gas injector as described herein.

The illustrations presented herein are not meant to be actual views of any particular component, device, or system, but are merely idealized representations that are employed to describe embodiments of the present invention.

A number of references are cited herein, and the disclosures of which are incorporated herein, in their entireties, by this reference for all purposes. Further, none of the cited references, regardless of how characterized herein, are admitted as prior art relative to the invention of the subject matter claim herein.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, InGaNP, etc.

Improved gas injectors have recently been developed for use in methods and systems that utilize an external source of a $GaCl_3$ precursor that is injected into the reaction chamber, such as those disclosed in the aforementioned U.S. Patent Application Publication No. US 2009/0223442 A1. Examples of such gas injectors are disclosed in, for example, U.S. Patent Application Ser. No. 61/157,112, which was filed on Mar. 3, 2009 in the name of Arena et al., the entire disclosure of which application is incorporated herein in its entirety by this reference. As used herein, the term "gas" includes gases (fluids that have neither independent shape nor volume) and vapors (gases that include diffused liquid or solid matter suspended therein), and the terms "gas" and "vapor" are used synonymously herein.

Embodiments of the present invention include, and make use of, new gas injectors as described in further detail below. In some embodiments, a deposition system 100 may comprise a CVD reaction chamber, and may comprise a VPE reaction chamber (e.g., an HVPE reaction chamber). As non-limiting examples, the deposition system 100 may comprise a deposition system as described in the aforementioned U.S. Patent Application Publication No. US 2009/0223442 A1, or a deposition system as described in the aforementioned U.S. Patent Application Ser. No. 61/157,112. A non-limiting example of an embodiment of a deposition system 100 of the invention that includes a reaction chamber 102 and one or more gas injectors (as described in further detail below) is described below with reference to FIGS. 1A and 1B.

In the following description of the deposition system 100 and, more particularly, the reaction chamber 102 of the deposition system 100, the terms "longitudinal" and "transverse" are used to refer to the directions relative to the reaction chamber 102 from the perspectives of FIGS. 1A and 1B, wherein the longitudinal direction is the vertical direction from the perspective of FIG. 1A and the direction extending into the plane of FIG. 1B, and the transverse or lateral directions are those extending horizontally from the perspective of each of FIGS. 1A and 1B. The transverse directions are also referred to as directions extending "across the reactor."

The deposition system 100 includes the reaction chamber 102, a substrate support structure 104 (e.g., a susceptor) configured to support one or more workpiece substrates 106 on which it is desired to deposit or otherwise provide material within the deposition system 100. For example, the workpiece substrates 106 may comprise dies or wafers. The deposition system 100 further includes heating elements 108 (FIG. 1B), which may be used to selectively heat the deposition system 100 such that an average temperature within the reaction chamber 102 may be controlled to within desirable elevated temperatures during deposition processes. The heating elements 108 may comprise, for example, resistive heating elements or radiant heating elements.

Figure 1B:
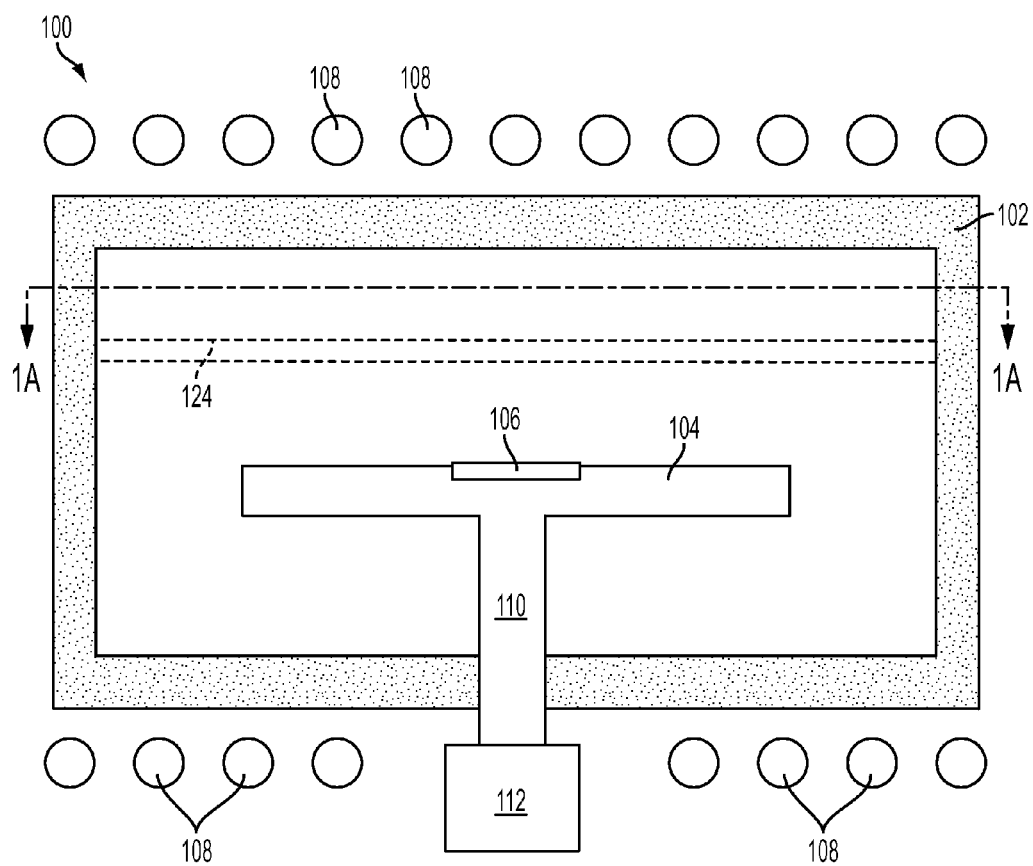
FIG. 1B is a schematic, cross-sectional view of the reaction chamber shown in FIG. 1A taken along Section Line 1B-1B shown therein.

As shown in FIG. 1B, the substrate support structure 104 may be mounted on a spindle 110, which may be coupled (e.g., directly structurally coupled, magnetically coupled, etc.) to a drive device 112, such as an electrical motor that is configured to drive rotation of the spindle 110 and, hence, the substrate support structure 104 within the reaction chamber 102.

In some embodiments, one or more of the reaction chamber 102, the substrate support structure 104, the spindle 110, and any other components within the reaction chamber 102 may be at least substantially comprised of a refractory ceramic material such as a ceramic oxide (e.g., silica (quartz), alumina, zirconia, etc.), a carbide (e.g., silicon carbide, boron carbide, etc.), or a nitride (e.g., silicon nitride, boron nitride, etc.).

The deposition system 100 further includes a gas flow system used to inject one or more gases into the reaction chamber 102 and to exhaust gases out from the reaction chamber 102. Referring to FIG. 1A, the deposition system 100 may include three gas inflow conduits 114A, 114B, 114C that carry gases from respective gas sources 128A, 128B, 128C. Optionally, gas valves 117A, 117B, 117C may be used to selectively control the flow of gas through the gas inflow conduits 114A, 114B, 114C, respectively.

In some embodiments, at least one of the gas sources 128A, 128B, 128C may comprise an external source of $GaCl_3$, $InCl_3$, or $AlCl_3$, as described in U.S. Patent Application Publication No. US 2009/0223442 A1. $GaCl_3$, $InCl_3$ and $AlCl_3$ may exist in the form of a dimer such as, for example, $Ga_2Cl_6$, $In_2Cl_6$ and $Al_2Cl_6$, respectively. Thus, at least one of the gas sources 128A, 128B, 128C may comprise a dimer such as $Ga_2Cl_6$, $In_2Cl_6$ or $Al_2Cl_6$. As a non-limiting example, one or more of the gas sources 128A, 128B, 128C may provide a mass flow of $GaCl_3$ vapor with a group III precursor component at about 25 grams per hour or more, or even at about 50 grams per hour or more. Further, in some embodiments, one or more of the gas sources 128A, 128B, 128C may be capable of maintaining such a flow rate for at least 500 deposition processes, at least 1,000 deposition processes, at least 2,000 deposition processes, or even at least 3,000 deposition processes.

In embodiments in which one or more of the gas sources 128A, 128B, 128C is or includes a GaCl$_3$ source, the GaCl$_3$ source include a reservoir of liquid GaCl$_3$ maintained at a temperature of at least 120° C. (e.g., approximately 130° C.), and may include physical means for enhancing the evaporation rate of the liquid GaCl$_3$. Such physical means may include, for example, a device configured to agitate the liquid GaCl$_3$, a device configured to spray the liquid GaCl$_3$, a device configured to flow carrier gas rapidly over the liquid GaCl$_3$, a device configured to bubble carrier gas through the liquid GaCl$_3$, a dive, such as a piezoelectric device, configured to ultrasonically disperse the liquid GaCl$_3$, and the like. As a non-limiting example, a carrier gas, such as He, N$_2$, H$_2$, or Ar, may be bubbled through the liquid GaCl$_3$, while the liquid GaCl$_3$ is maintained at a temperature of at least 120° C., such that the source gas may include one or more carrier gases.

The flux of the GaCl$_3$ vapor into one or more of the gas injectors 150A, 150B, 150C may be controlled in some embodiments of the invention. For example, in embodiments in which a carrier gas is bubbled through liquid GaCl$_3$, the GaCl$_3$ flux from the gas source 128A, 128B, 128C is dependent on one or more factors, including for example, the temperature of the GaCl$_3$, the pressure over the GaCl$_3$, and the flow of carrier gas that is bubbled through the GaCl$_3$. While the mass flux of GaCl$_3$ can in principle be controlled by any of these parameters, in some embodiments, the mass flux of GaCl$_3$ may be controlled by varying the flow of the carrier gas using a mass flow controller.

In some embodiments, the one or more of the gas sources 128A, 128B, 128C may be capable of holding about 25 kg or more of GaCl$_3$, about 35 kg or more of GaCl$_3$, or even about 50 kg or more of GaCl$_3$. For example, the GaCl$_3$ source my be capable of holding between about 50 and 100 kg of GaCl$_3$ (e.g., between about 60 and 70 kg). Furthermore, multiple sources of GaCl$_3$ may be connected together to form a single one of the gas sources 128A, 128B, 128C using a manifold to permit switching from one gas source to another without interrupting operation and/or use of the deposition system 100. The empty gas source may be removed and replaced with a new full source while the deposition system 100 remains operational.

In some embodiments, the temperatures of the gas inflow conduits 114A, 114B, 114C may be controlled between the gas sources 128A, 128B, 128C and the gas injectors 150A, 150B, 150C. The temperatures of the gas inflow conduits 114A, 114B, 114C and associated mass flow sensors, controllers, and the like may increase gradually from a first temperature (e.g., about 120° C. or more) at the exit from the respective gas sources 128A, 128B, 128C up to a second temperature (e.g., about 160° C. or less) at the gas injectors 150A, 150B, 150C in order to prevent condensation of the gases (e.g., GaCl$_3$ vapor) in the gas inflow conduits 114A, 114B, 114C and the like. Optionally, the length of the gas inflow conduits 114A, 114B, 114C between the respective gas sources 128A, 128B, 128C and the gas injectors 150A, 150B, 150C may be about three feet or less, about two feet or less, or even about one foot or less. The pressure of the source gases may be controlled using one or more pressure control systems.

Each of the three gas inflow conduits 114A, 114B, 114C extends to a respective one of three gas injectors 150A, 150B, 150C, various different embodiments of which are disclosed in further detail below.

In additional embodiments, the deposition system 100 may include less than three (e.g., one or two) gas inflow conduits and respective gas injectors, or the deposition system 100 may include more than three (e.g., four, five, et al.) gas inflow conduits and respective gas injectors.

In the embodiment of FIGS. 1A and 1B, the gas injectors 150A, 150B, 150C are located entirely outside the reaction chamber 102. In other embodiments, however, the gas injectors 150A, 150B, 150C may be disposed entirely within the reaction chamber 102, or at least a portion of the gas injectors 150A, 150B, 150C may extend at least partially through the reaction chamber 102.

The deposition system 100 may further include three gas ports 116A, 116B, 116C that provide fluid communication between the exterior and the interior of the reaction chamber 102. Each of the gas ports 116A, 116B, 116C may provide fluid communication through one or more of a wall, the ceiling or the floor of the reaction chamber 102 between a respective one of the gas injectors 150A, 150B, 150C and a respective gas dispersion conduit 118A, 118B, 118C within the reaction chamber 102.

The gas dispersion conduits 118A, 118B, 118C within the reaction chamber 102 may be used to carry the gases to desirable locations within the enclosure, and may include openings 120 at selected locations along the gas dispersion conduits 118A, 118B, 118C. The openings 120 may be located and configured to inject gases into the interior of the reaction chamber 102 in selected directions relative to the workpiece substrates 106 carried upon the substrate support structure 104.

As shown in FIGS. 1A and 1B, the gas dispersion conduits 118A, 118C may converge with one another, such that the gases therein may mix together prior to exiting through the apertures 120. Thus, gases carried by the gas dispersion conduits 118A, 118C, such as precursor gases and carrier gases, may flow in the longitudinal direction through the reaction chamber 102 (the vertical direction from the perspective of FIG. 1A) and may be injected out from the openings 120 in directions extending toward the workpiece substrates 106 longitudinally within the reaction chamber 102, the directions being oriented at least substantially parallel to upper exposed major surfaces of the workpiece substrates 106. The gas carried by the gas dispersion conduit 118B, such as precursor gas and carrier gas, also may flow in the longitudinal direction through the reaction chamber 102, and may be injected out from the openings 120 in the gas dispersion conduit 118B in directions extending toward the workpiece substrates 106 longitudinally through the reaction chamber 102, the directions being oriented at least substantially parallel to upper exposed major surfaces of the workpiece substrates 106.

The gas dispersion conduits 118A, 118B, 118C may be supported and held in place within the reaction chamber 102 using conduit support fixtures.

The particular layout and configuration of the gas dispersion conduits 118A, 118B, 118C is merely one of many layouts and configurations that may be used in embodiments of the invention, and additional embodiments of reaction chambers 100 of the invention may have different configurations and layouts of gas dispersion conduits within the reaction chamber 102.

The gas dispersion conduits 118A, 118B, 118C may be actively heated, passively heated, or both passively and actively heated. For example, heat-producing elements (not shown) may be positioned adjacent to at least a portion of the gas dispersion conduits 118A, 118B, 118C. In some embodiments, the gas dispersion conduits 118A, 118B, 118C are heated by the heating elements 108. Optionally, passive heat transfer structures (e.g., structures comprising materials that behave similarly to a black body) may be located adjacent or proximate to at least a portion of the gas dispersion conduits 118A, 118B, 118C within the reaction chamber 102 to improve transfer of heat to the gas dispersion conduits 118A, 118B, 118C.

Passive heat transfer structures (e.g., structures comprising materials that behave similarly to a black body) may be provided within the reaction chamber 102 as disclosed in, for example, U.S. Patent Application Publication No. US 2009/0214785 A1, which published on Aug. 27, 2009 in the name of Arena et al., now U.S. Pat. No. 8,388,755, issued Mar. 5, 2013, the entire disclosure of which is incorporated herein by reference. For example, a heat transfer plate 124 (represented in FIGS. 1A and 1B by a dashed line) may be positioned within the reaction chamber 102 such that the heat transfer plate 124 extends across the reaction chamber 102 over the substrate support structure 104 and the workpiece substrates 106 supported by the substrate support structure 104. The heat transfer plate 124 may aid in thermalizing process gases flowing in proximity to the heat transfer plate 124 by absorbing radiation from heating elements (such as the heating elements 108), and reradiating the absorbed heat into the process gases.

Such a passive heat transfer structure may improve the transfer of heat within the interior of the reaction chamber 102, and may improve the homogeneity and consistency of the temperature within the reaction chamber 102. The passive heat transfer structures may comprise materials with high emissivity values (close to unity) (black body materials) that are also capable of withstanding the high temperature, corrosive environments that may be encountered within the deposition system 100. Such materials may include, for example, aluminum nitride (AlN), silicon carbide (SiC), and boron carbide ($B_4C$), which have emissivity values of 0.98, 0.92, and 0.92, respectively.

Gaseous byproducts, carrier gases, and any excess precursor gases may be exhausted out from the reaction chamber 102 through a chamber outlet 126.

As previously mentioned, one or more of the gas injectors 150A, 150B, 150C of the deposition system 100 of FIGS. 1A and 1B may be or include one of the various embodiments of gas injectors described in further detail below.

In some embodiments, a gas injector of the present invention may include a thermalizing gas injector as described in U.S. Patent Application Ser. No. 61/157,112, but further including a reservoir configured to hold a liquid reagent for reacting with a source gas (or a decomposition or reaction product of a source gas). For example, the reservoir may be configured to hold a liquid metal or other element, such as, for example, liquid gallium (Ga), liquid aluminum (Al), or liquid indium (In). In further embodiments of the invention, the reservoir may be configured to hold a solid reagent for reacting with a source gas (or a decomposition or reaction product of a source gas). For example, the reservoir may be configured to hold a solid volume of one or more materials, such as, for example, solid silicon (Si) or solid magnesium (Mg).

Figures 2, 3:
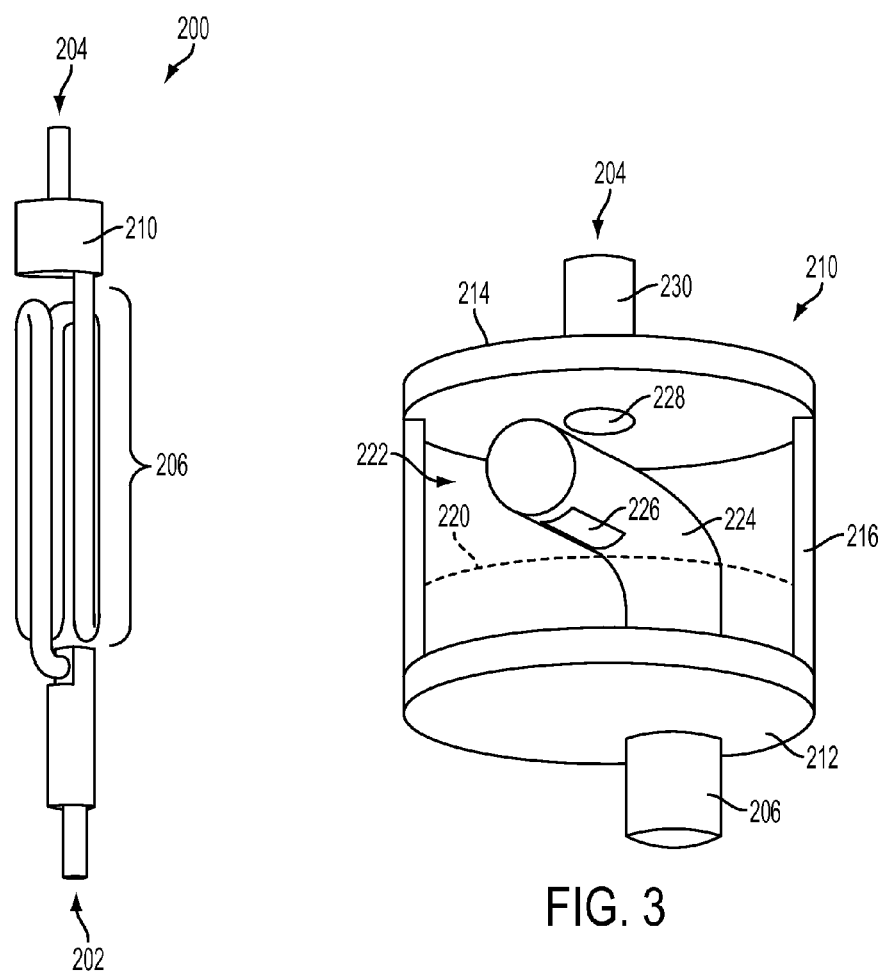
FIG. 2 schematically illustrates an example embodiment of a gas injector of the invention, one or more of which may be used in embodiments of deposition systems of the invention, such as the deposition system of FIG. 1.
FIG. 3 is an enlarged, partially cut-away view of a portion of the gas injector of FIG. 2.

FIG. 2 is a perspective view of an embodiment of a gas injector 200 of the invention. As shown in FIG. 2, the gas injector 200 includes an inlet 202, an outlet 204, a thermalizing conduit 206, and a container 210. The container 210 is configured to hold a liquid reagent therein. For example, a liquid metal such as liquid gallium, liquid indium, liquid aluminum, etc., may be disposed within the container 210. A source gas such as, for example, $GaCl_3$ and one or more carrier gases (e.g., $H_2$), may be supplied to the inlet 202. The source gas may flow from the inlet 202 into the thermalizing conduit 206. The thermalizing conduit 206 may be configured to heat the source gas flowing through the thermalizing conduit 206 for a desirable amount of time (i.e., a residence time), which may be a function of the cross-sectional area of the flow path within the thermalizing conduit 206, the flow rate of the source gas through the thermalizing conduit 206, and the overall length of the thermalizing conduit 206. The thermalizing conduit 206 may be shaped and configured to be located proximate to one or more active or passive heating elements, as discussed in further detail below.

Furthermore, the thermalizing conduit 206 may include one or more curved sections or turns, such that the length of the physical space occupied by the thermalizing conduit 206 is significantly less than the actual length of the flow path through the thermalizing conduit 206. Stated another way, a length of the thermalizing conduit 206 may be longer than a shortest distance between the inlet 202 and the liquid container 210. In some embodiments, the length of the thermalizing conduit 206 may be at least about twice the shortest distance between the inlet 202 and the liquid container 210, at least about three times the shortest distance between the inlet 202 and the liquid container 210, or even at least about four times the shortest distance between the inlet 202 and the liquid container 210. For example, the thermalizing conduit 206 may have a serpentine configuration, as shown in FIG. 2, which includes a plurality of generally parallel straight sections connected together in an end-to-end fashion by curved sections that extend through an angle of 180°.

The thermalizing conduit 206 may comprise a tube that is at least substantially comprised of a refractory material such as, for example, quartz.

In some embodiments, the source gas may at least partially decompose within the thermalizing conduit 206. For example, in embodiments in which the source gas comprises $GaCl_3$ and a carrier gas comprising $H_2$, the source gas may decompose to form gaseous GaCl and hydrogen chloride (HCl).

The gases flow from the thermalizing conduit 206 into the container 210. FIG. 3 is an enlarged, partially cut-away view of the container 210. As shown in FIG. 3, the container 210 includes a bottom wall 212, a top wall 214, and at least one side wall 216. In the embodiment of FIGS. 2 and 3, the reservoir has a generally cylindrical shape, such that each of the bottom wall 212 and the top wall 214 has a circular shape and is at least substantially planar, and such that the side wall 216 is at least substantially cylindrical (e.g., tubular). In additional embodiments of the invention, the reservoir may be configured in alternative geometrical configurations. The bottom wall 212, the top wall 214, and the at least one side wall 216 together define a hollow body, the interior of which defines a reservoir for holding a liquid reagent, such as liquid gallium.

The interior space within the hollow container 210 may be partially filled with a liquid reagent. For example, the container 210 may be filled with a liquid reagent to the level indicated by a dashed line 220 in FIG. 3, such that a void or space 222 is present over the liquid reagent within the container 210. Gases flowing out from the thermalizing conduit 206 may be injected into the space 222 over the liquid reagent within the container 210. As a non-limiting example, the gases flowing out from the thermalizing conduit 206 may flow through the bottom wall 212 into a tube 224. In some embodiments, the tube 224 may comprise an integral portion of the thermalizing conduit 206 that extends into the container 210. The tube 224 may extend through the liquid reagent disposed within the liquid container to the space 222 over the liquid reagent. The tube 224 may comprise a ninety-degree bend, such that an end portion of the tube 224 extends horizontally over the liquid reagent.

As shown in FIG. 3, an aperture 226 may be provided through the cylindrical sidewall of the tube 224 on a side thereof facing the surface of the liquid reagent, such that gases flowing through the tube 224 will exit the tube 224 through the aperture 226. The gases exiting the aperture 226 may be directed out from the aperture in a direction oriented toward the surface of the liquid reagent to promote reaction between one or more components of the gases and the liquid reagent. For example, in embodiments in which the source gas comprises $GaCl_3$ carried within a carrier gas such as $H_2$, and the source gas has decomposed to include gaseous GaCl and a chlorinated species such as, for example, hydrogen chloride (HCl) within the thermalizing conduit 206, the liquid reagent within the liquid container may comprise liquid gallium, which may react with the chlorinated gas (e.g., HCl) generated within the thermalizing conduit 206 to form additional gaseous GaCl. The gases within the space 222 over the liquid reagent within the container 210 may flow out from the container through an outlet port 228. For example, the outlet port 228 may be located in the top wall 214 of the container over the horizontally extending portion of the tube 224. The outlet port 228 may lead to an outlet conduit 230, the end of which may define the outlet 204 of the gas injector 200.

The various components of the container 210 may be at least substantially comprised of a refractory material such as, for example, quartz.

The GaCl may be a desirable precursor gas for forming GaN. Thus, by converting the excess chlorinated species such as, for example, hydrogen chloride gas (HCl) that results from thermal decomposition of $GaCl_3$ and $H_2$ (in systems that employ a source gas comprising $GaCl_3$ and $H_2$) into additional GaCl, detrimental effects of excess chlorinated species to the deposited GaN material may be avoided, since the amount of chlorinated species entering the reaction chamber 102 may be reduced. Such detrimental effects may include, for example, incorporation of chlorine atoms into the gallium nitride crystal lattice and cracking or delamination of the deposited GaN film. Introducing excess hydrogen chloride gas (HCl) into the reaction chamber may result in the hydrogen chloride acting as an etchant to the GaN within the reaction chamber, thereby reducing the growth rate or even preventing growth of the GaN. Furthermore, by reacting the excess chlorinated species with the liquid gallium to form additional GaCl, the efficiency of the deposition system 100 may be improved.

Figure 4:
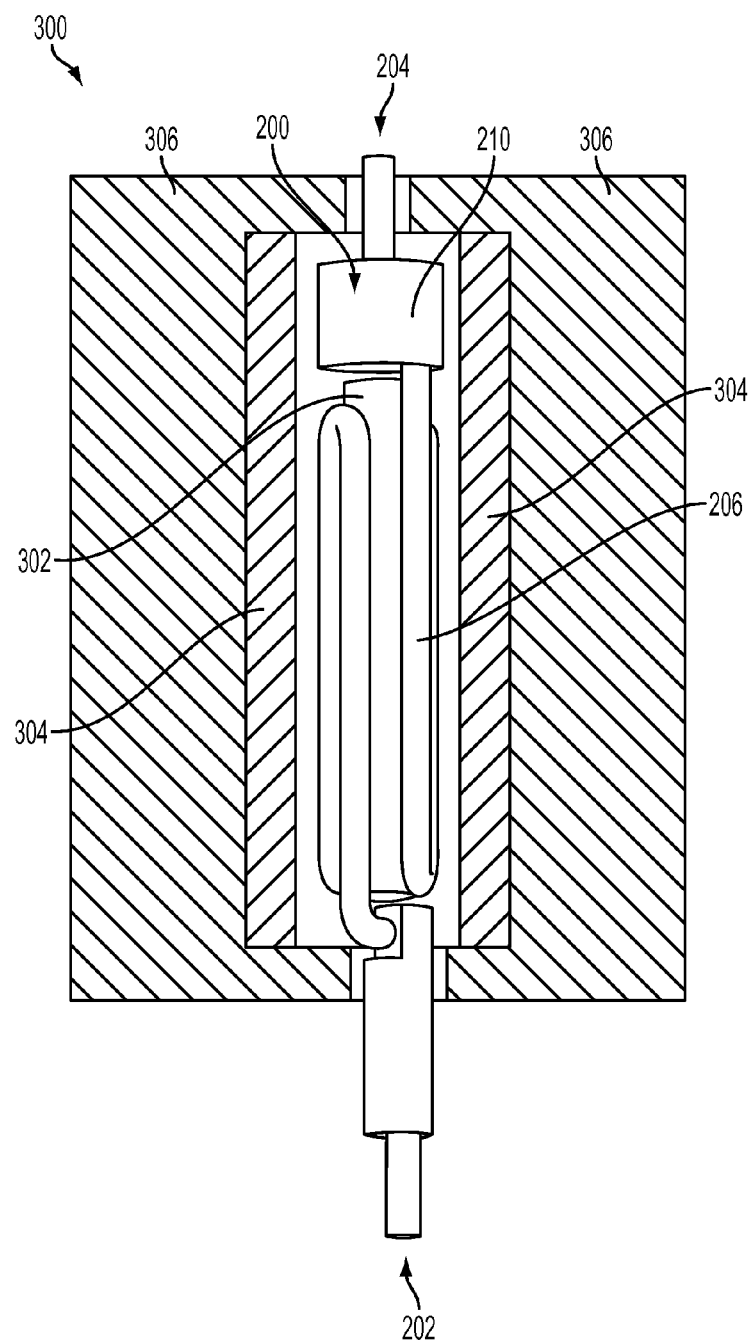
FIG. 4 schematically illustrates another embodiment of a gas injector of the invention that is similar to that of FIG. 2, but further includes active and passive heating elements.

FIG. 4 illustrates another embodiment of a thermalizing gas injector 300 that includes the gas injector 200 of FIG. 2, as well as active and passive heating components for heating at least the thermalizing conduit 206 and the container 210 of the gas injector 200. In other words, at least one heating element may be disposed proximate to at least one of the thermalizing conduit 206 and the liquid container 210 to heat at least one of the thermalizing conduit 206 and the container 210 of the gas injector 200.

As shown in FIG. 4, the thermalizing gas injector 300 includes a cylindrical passive heating element 302 that is disposed within a generally cylindrical space that is surrounded by the thermalizing conduit 206 of the gas injector 200.

The passive heating element 302 may be at least substantially comprised of materials with high emissivity values (close to unity) (black body materials) that are also capable of withstanding the high-temperature, corrosive environments that may be encountered within the deposition system 100. Such materials may include, for example, aluminum nitride (AlN), silicon carbide (SiC), and boron carbide ($B_4C$), which have emissivity values of 0.98, 0.92, and 0.92, respectively.

The passive heating element 302 may be solid or hollow. In some embodiments, the passive heating element 302 may be hollow, and a thermocouple may be positioned within the interior space of the passive heating element for temperature monitoring and control purposes. In additional embodiments, a cylindrical thermocouple may be positioned around the passive heating element 302 and between the passive heating element 302 and the surrounding thermalizing conduit 206.

In additional embodiments, hollow cylindrical passive heating elements may be disposed over and around one or more straight sections of the thermalizing conduit 206. In such embodiments, a cylindrical thermocouple may be positioned between the hollow cylindrical passive heating elements and the sections of the thermalizing conduit 206 surrounded by the hollow cylindrical passive heating elements.

The thermalizing gas injector 300 also may include an active heating element 304. The active heating element 304 may at least partially surround each of the thermalizing conduit 206 and the container 210 of the gas injector 200. In some embodiments, the active heating element 304 may be generally cylindrical and may extend entirely around at least a portion of each of the thermalizing conduit 206 and the container 210, as shown in FIG. 4. The active heating element 304 may comprise, for example, at least one of a resistive heating element, an inductive heating element, and a radiant heating element. An insulating jacket 306 may at least substantially surround the gas injector 200, the passive heating element 302, and the active heating element 304, as shown in FIG. 4, so as to improve the efficiency of the heating process by which the active heating element 304 and the passive heating element 302 heat the thermalizing conduit 206 (or at least the gas or gases contained therein) and the container 210 (or at least the liquid reagent and gas or gases contained therein).

The active and passive heating elements of the thermalizing gas injector 300 may be capable of heating the thermalizing conduit 206, the container 210 and the source gas to temperatures between about 500° C. and about 1,000° C.

Figure 5:
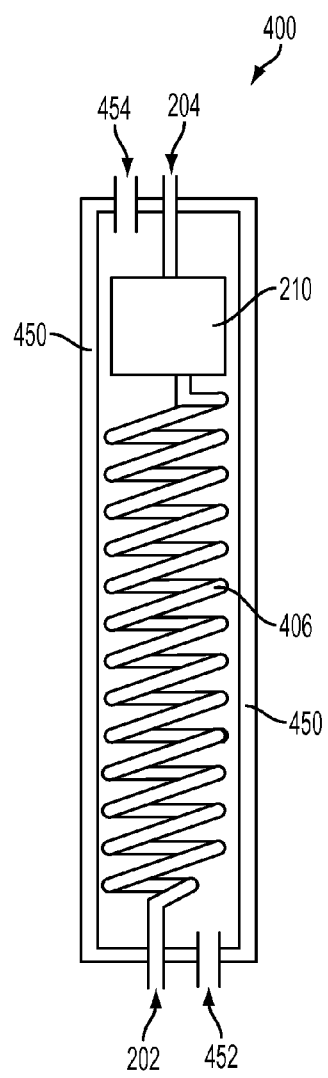
FIG. 5 schematically illustrates another example embodiment of a gas injector of the invention, one or more of which may be used in embodiments of deposition systems of the invention, such as the deposition system of FIG. 1.

FIG. 5 illustrates another embodiment of a gas injector 400 of the invention. The gas injector 400 of FIG. 5 is similar to the gas injector 200 of FIG. 2, and includes an inlet 202, an outlet 204, a thermalizing conduit 406, and a container 210. The container 210 may be as described in relation to FIGS. 2 and 3. The thermalizing conduit 406 is substantially similar to the thermalizing conduit 206 of FIG. 2, except that the thermalizing conduit 406 extends along a spiral path (i.e., has a spiral configuration), instead of having a serpentine configuration, as does the thermalizing conduit 206 of FIG. 2.

As shown in FIG. 5, embodiments of the invention may also include an outer housing 450. The outer housing 450 may be configured to enclose and protect at least the thermalizing conduit 406 and the container 210 of the gas injector 400. The outer housing 450 may also serve as an additional gas-conducting conduit that may be used, for example, to convey purge gases (e.g., inert gases). For example, the outer housing 450 may include an inlet port 452 and an outlet port 454, such that a gas may flow through the outer housing 450 between the inlet port 452 and the outlet port 454. In additional embodiments of the invention, an outer housing 450 may be provided on the gas injector 200 of FIG. 2, the gas injector 300 of FIG. 4, or any other gas injector described herein below.

With continued reference to FIG. 5, in operation, a source gas such as $GaCl_3$ and a carrier gas such as $H_2$ enters the gas injector 400 through the inlet 202 with an incoming flow rate of usually on the order of several hundred standard cubic centimeters per minute (sccm). The flow rate, however, may be as high as twenty to thirty standard liters per minute (SLM) or higher. The gaseous precursors, such as GaCl, exit the gas injector 400 through the outlet 204 at temperatures between about 500° C. and about 1,000° C. An inert purge gas, such as $N_2$ or a mixture of $N_2$ and $H_2$, enters the outer housing 450 through inlet port 452 with an incoming flow rate of approximately one to five SLM, and maintains an overpressure in at least the interior of the outer housing 450. The inert purge gas exits the outer housing 450 through the outlet port 454. The purge gas may also be heated as it passes through the outer housing 450.

Figure 6:
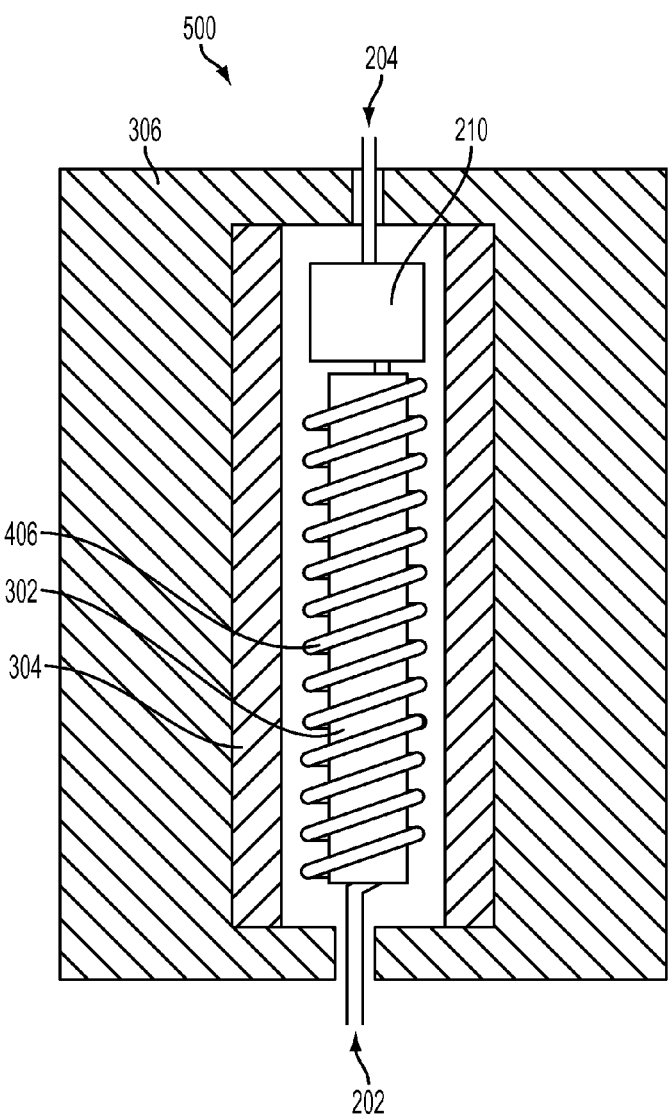
FIG. 6 schematically illustrates another embodiment of a gas injector of the invention that is similar to that of FIG. 5, but further includes active and passive heating elements.

FIG. 6 illustrates another embodiment of a thermalizing gas injector 500 that includes a gas injector substantially similar to the gas injector 400 of FIG. 5, but without the outer housing 454. Thus, the gas injector 500 includes a thermalizing conduit 406 and a container 210, as previously described herein. The gas injector 500 further includes an inlet 202 and an outlet 204. The thermalizing gas injector 500 of FIG. 6 further includes active and passive heating elements like those previously described in relation to the gas injector 300 of FIG. 4. In particular, the gas injector 500 of FIG. 6 includes the previously described cylindrical passive heating element 302, which is disposed within a generally cylindrical space that is surrounded by the spiral thermalizing conduit 406 of the gas injector 500. The thermalizing gas injector 500 also may include an active heating element 304 and an insulating jacket 306, as previously described in relation to FIG. 4. As previously discussed, the active and passive heating elements of the thermalizing gas injector 500 may be capable of heating the thermalizing conduit 406 and the container 210 to temperatures between about 500° C. and about 1,000° C.

Referring again to FIG. 1A, in some embodiments of the invention, two or more of the gas injectors 150A, 150B, 150C may be used to generate a common Group III metal precursor to provide an increased flow rate of that specific Group III metal precursor into the reaction chamber 102. Each gas injector 150A, 150B, 150C may only be capable of supplying a Group III metal precursor and one or more carrier gases at a maximum flow rate, which may be a function of the size of the gas injector and the capabilities of the gas source 128A, 128B, 128C. Thus, for large reaction chambers 102 that need relatively large incoming flow rates of the Group III metal precursor, the number of gas injectors used to supply a single Group III metal precursor may be selected such that the sum of the individual flow rates of the gas injectors provides the desirable total incoming flow rate of the Group III metal precursor into the reaction chamber.

In additional embodiments of the invention, two or more of the gas injectors 150A, 150B, 150C may be used to generate different Group III metal precursors that may be used to deposit Group III nitride compound materials that include two or more different Group III elements such as, for example, InGaN, AlGaN, InAlGaN, etc. By way of example and not limitation, the first gas injector 150A may be used to supply GaCl (by converting $GaCl_3$ and H, into gaseous GaCl by thermal decomposition of $GaCl_3$ and $H_2$, and by reaction of chlorinated species resulting from such thermal decomposition of $GaCl_3$ and $H_2$ with liquid gallium), the third gas injector 150C may be used to supply InCl (by converting $InCl_3$, and N, into gaseous InCl by thermal decomposition of $InCl_3$ and $N_2$, and by reaction of chlorinated species resulting from such thermal decomposition of $InCl_3$ and $N_2$ with liquid indium), and the second gas injector 150B may be used to supply gaseous ammonia ($NH_3$). The deposition system 100 may include any number of desirable gas injectors needed to supply the desired flow rates of each of the precursor gases needed to deposit any desired compound III-V semiconductor material.

In yet additional embodiments of the invention, at least one of the gas injectors 150A, 150B, 150C may be used to generate a dopant precursor (e.g., iron chloride (FeCl), chlorosilane species, or magnesium chloride species) that may be used to carry a dopant (e.g., iron, silicon, magnesium atoms or ions) into the reaction chamber 102. During the deposition process, the dopant precursor may decompose and/or react with another substance within the reaction chamber 102 in such a manner as to result in the dopant being incorporated into the III-V semiconductor material being deposited. In such embodiments, it may not be necessary to thermally decompose the dopant precursor in the gas injector used to inject the dopant precursor. For example, the gas injector may include a reservoir configured to hold a solid reagent for reacting with a source gas (or a decomposition or reaction product of a source gas). For example, the reservoir may be configured to hold a solid volume of one or more materials, such as, for example, solid silicon (Si) or solid magnesium (Mg).

Figure 7:
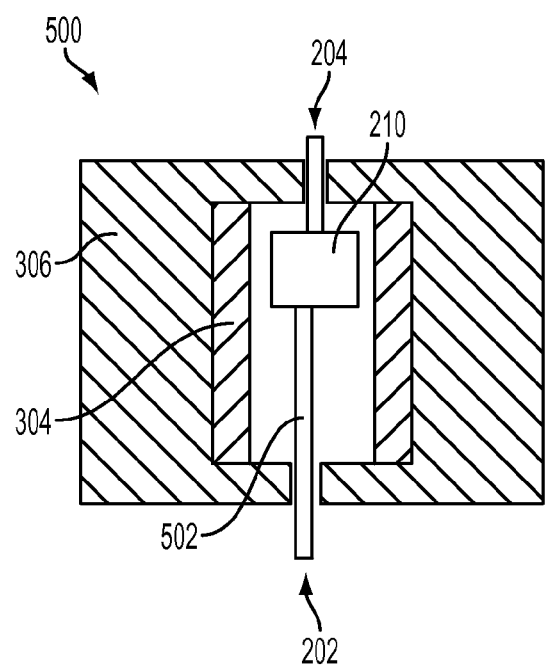
FIG. 7 schematically illustrates another embodiment of a gas injector, one or more of which may be used to inject precursor gases into reaction chambers of embodiments of deposition systems of the invention, such as the deposition system of FIG. 1.

Thus, FIG. 7 illustrates an example of a gas injector 500 that may be used to inject such dopant precursors into the reaction chamber 102. The gas injector 500 includes an inlet 202, an outlet 204, and a container 210 as previously described in relation to FIGS. 2 and 3. A generally straight conduit 502 may extend from the inlet 202 to the container 210 (in place of the thermalizing conduit 206 of FIGS. 2 and 3). The container 210 may be configured to hold a liquid metal reagent therein, such as, for example, liquid aluminum, liquid indium, liquid iron, etc.

The gas injector 500 also may include active and/or passive heating elements, such as, for example, the active heating element 304 and the insulating jacket 306 previously described in relation to the gas injector 300 of FIG. 4. Active and/or passive heating elements may be used to heat the container 210 (or at least the liquid contained therein) to temperatures sufficient to maintain the metal within the container 210 in the liquid state.

A source gas, such as gaseous hydrochloric acid (HCl) may be supplied from a gas source 128A, 128B, 128C to the inlet 202. The source gas may flow from the inlet 202 through the conduit 502 to the container 210, where the source gas may react with the liquid metal reagent within the container to form a precursor gas (e.g., InCl, AlCl, FeCl, etc.). The precursor gas may flow out from the container 210 through the outlet 204.

The flow rate of the gases through the gas injector 500 relative to the flow rates of the other gas injectors of the deposition system 100 may be selectively controlled so as to control the concentration of the elements deposited from the dopant precursor in the resulting III-V semiconductor material.

Figure 8:
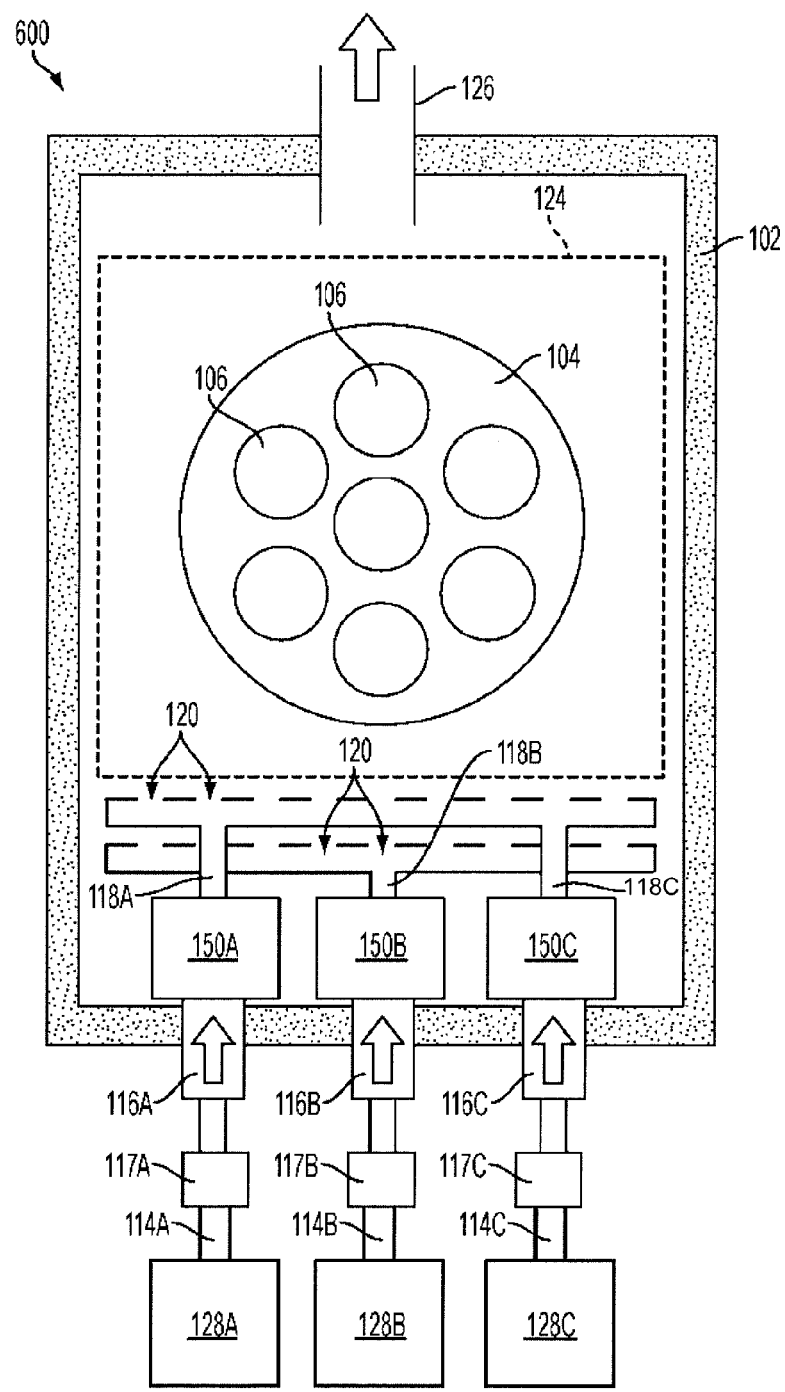
FIG. 8 schematically illustrates another example embodiment of a deposition system of the invention.

As previously mentioned, the gas injectors 150A, 150B, 150C of the deposition system 100 of FIGS. 1A and 1B may be located entirely outside the reaction chamber 102 (as shown in FIGS. 1A and 1B), entirely within the reaction chamber 102, or at least a portion of the gas injectors 150A, 150B, 150C may extend at least partially through the reaction chamber 102. FIG. 8 illustrates an additional embodiment of a deposition system 600 of the present invention that is at least substantially similar to the deposition system 100 of FIGS. 1A and 1B, except that the gas injectors 150A, 150B, 150C are located within the reaction chamber 102.

As described above, embodiments of thermalizing gas injectors of the invention may be used to inject gaseous Group III metal precursors into a reaction chamber for the processing of III-nitride compounds. For example, in some embodiments, the thermalizing gas injectors of the invention may be used to convert GaCl$_3$ and H$_2$ into gaseous GaCl by thermal decomposition of GaCl$_3$ and H$_2$, and by reaction of a chlorinated species (e.g., hydrogen chloride (HCl)) resulting from such thermal decomposition of GaCl$_3$ and H$_2$ with liquid gallium, and to inject GaCl into a reaction chamber for the deposition of GaN in an HVPE process.

The embodiments of the invention described above do not limit the scope the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims.

What is claimed is:

1. A thermalizing gas injector for injecting one or more gases into a reaction chamber of a deposition system, comprising:
   an inlet;
   a thermalizing conduit;
   a liquid container holding liquid metal reagent therein;
   an outlet;
   a pathway extending from the inlet, through the thermalizing conduit to an interior space within the liquid container, and from the interior space within the liquid container to the outlet, the thermalizing conduit having a length greater than a shortest distance between the inlet and the liquid container; and
   at least one active heating element and at least one passive heating element disposed proximate the thermalizing conduit and the liquid container, the thermalizing conduit surrounding a generally cylindrical space in which the at least one passive heating element is disposed, the at least one active heating element surrounding the thermalizing conduit and the at least one passive heating element, the at least one active heating element and the at least one passive heating element configured to provide thermal energy for heating one or more gases within the thermalizing conduit and the liquid container and to heat one or more gases within the at least one of the thermalizing conduit and the liquid container to a temperature between about 500° C. and about 1,000° C., the at least one passive heating element comprised of at least one of aluminum nitride (AlN), silicon carbide (SIC), and boron carbide (B$_4$C).

2. The thermalizing gas injector of claim 1, wherein the liquid metal reagent comprises at least one of liquid gallium, liquid indium, and liquid aluminum.

3. The thermalizing gas injector of claim 1, wherein at least one of the thermalizing conduit and the liquid container is at least substantially comprised of quartz.

4. The thermalizing gas injector of claim 1, wherein the at least one active heating element comprises at least one of a resistive heating element, an inductive heating element, and a radiant heating element.

5. The thermalizing gas injector of claim 1, wherein the length of the thermalizing conduit is at least about twice the shortest distance between the inlet and the liquid container.

6. The thermalizing gas injector of claim 5, wherein the length of the thermalizing conduit is at least about four times the shortest distance between the inlet and the liquid container.

7. The thermalizing gas injector of claim 1, wherein the at least one passive heating element disposed proximate the thermalizing conduit comprises an elongated heating element, and wherein the thermalizing conduit entirely surrounds the elongated heating element.

8. The thermalizing gas injector of claim 7, wherein the thermalizing conduit surrounding the elongated heating element has a coiled configuration or a serpentine configuration.

9. The thermalizing gas injector of claim 7, wherein the elongated heating element is generally cylindrical.

10. The thermalizing gas injector of claim 1, wherein the thermalizing conduit is disposed in a generally cylindrical space between the at least one active heating element and the at least one passive heating element.

11. The thermalizing gas injector of claim 1, further comprising an outer housing configured to enclose at least the thermalizing conduit and the liquid container.

12. The thermalizing gas injector of claim 11, wherein the outer housing defines a gas-conducting pathway configured to convey gas through the thermalizing gas injector in a space within the outer housing and outside the thermalizing conduit.

13. The thermalizing gas injector of claim 1, wherein the at least one passive heating element is located under the liquid container.

14. A deposition system, comprising:
   a reaction chamber; and
   at least one thermalizing gas injector disposed outside the reaction chamber and configured to inject one or more gases into the reaction chamber, the thermalizing gas injector
   comprising:
   an inlet;
   a thermalizing conduit;
   a liquid container holding a liquid metal reagent therein;
   an outlet;
   a pathway extending from the inlet, through the thermalizing conduit to an interior space within the liquid container, and from the interior space within the liquid container to the outlet, the thermalizing conduit having a length greater than a shortest distance between the inlet and the liquid container; and
   at least one active heating element and at least one passive heating element disposed proximate the thermalizing conduit and the liquid container, the thermalizing conduit surrounding a generally cylindrical space in which the at least one passive heating element is disposed, the at least one active heating element surrounding the thermalizing conduit and the at least one passive heating element, the at least one active heating element and the at least one passive heating element configured to heat one or more gases within the thermalizing conduit and the liquid container to a temperature between about 500° C. and about 1,000° C., the at least one passive heating element comprised of at least one of aluminum nitride (AlN), silicon carbide (SIC), and boron carbide (B$_4$C).

15. The deposition system of claim 14, further comprising:
   at least one gas source; and
   at least one gas inflow conduit configured to carry a source gas from the gas source to the inlet of the at least one thermalizing gas injector.

16. The deposition system of claim 15, wherein the at least one gas source comprises a source of at least one of GaCl$_3$, InCl$_3$, and AlCl$_3$.

17. The deposition system of claim 14, wherein the liquid metal reagent comprises at least one of liquid gallium, liquid indium, and liquid aluminum.

18. The deposition system of claim 14, wherein at least one of the thermalizing conduit and the liquid container is at least substantially comprised of quartz.

19. The deposition system of claim 14, wherein the at least one active heating element comprises at least one of a resistive heating element, an inductive heating element, and a radiant heating element.

20. The deposition system of claim 14, wherein the length of the thermalizing conduit is at least about twice the shortest distance between the inlet and the liquid container.

21. The deposition system of claim 14, wherein the at least one thermalizing gas injector comprises two or more thermalizing gas injectors.

22. The deposition system of claim 21, wherein the two or more thermalizing gas injectors comprises:
    a first thermalizing gas injector, liquid gallium disposed in the liquid container of the first thermalizing gas injector; and
    a second thermalizing gas injector, at least one of liquid indium and liquid aluminum disposed in the liquid container of the second thermalizing gas injector.

23. The deposition system of claim 22, further comprising:
    a first gas source configured to supply $GaCl_3$ to the inlet of the first thermalizing gas injector; and
    a second gas source configured to supply at least one of $InCl_3$ and $AlCl_3$ to the inlet of the second thermalizing gas injector.

24. The deposition system of claim 14, further comprising:
    another gas injector configured to inject a dopant gas precursor into the reaction chamber, the
    another gas injector comprising:
    an inlet;
    a conduit;
    a liquid container configured to hold a liquid dopant reagent therein;
    an outlet; and
    a pathway extending from the inlet, through the conduit to an interior space within the liquid container, and from the interior space within the liquid container to the outlet; and
    a gas source configured to supply gaseous HCl to the inlet of the another gas injector.

25. The deposition system of claim 24, further comprising a liquid dopant within the liquid container.

26. The deposition system of claim 25, wherein the liquid dopant comprises liquid iron.

* * * * *